(12) United States Patent
Park et al.

(10) Patent No.: US 8,132,660 B2
(45) Date of Patent: Mar. 13, 2012

(54) SYSTEM FOR HANDLING SEMICONDUCTOR MODULE

(75) Inventors: Chul-jun Park, Seoul (KR); Yong-soo Shin, Yongin-si (KR); Jae-woong Hwang, Daejeon (KR); Jin-gi Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 495 days.

(21) Appl. No.: 12/320,922

(22) Filed: Feb. 9, 2009

(65) Prior Publication Data
US 2009/0236202 A1 Sep. 24, 2009

(30) Foreign Application Priority Data
Mar. 18, 2008 (KR) .................. 10-2008-0024890

(51) Int. Cl.
*B65G 15/64* (2006.01)
(52) U.S. Cl. .................. 198/345.1; 198/346
(58) Field of Classification Search ............. 198/339.1, 198/341.02, 341.05, 345.1, 346
See application file for complete search history.

(56) References Cited

U.S. PATENT DOCUMENTS

| 4,627,151 A * | 12/1986 | Mulholland et al. ........ 438/111 |
| 5,232,505 A * | 8/1993 | Novak et al. ................ 118/712 |
| 5,310,039 A * | 5/1994 | Butera et al. .............. 198/346.2 |
| 5,549,444 A * | 8/1996 | Dubuit ....................... 414/796.7 |
| 5,708,222 A * | 1/1998 | Yonezawa et al. ........... 73/865.8 |
| 5,725,347 A * | 3/1998 | Hansen ..................... 414/226.03 |
| 5,901,829 A * | 5/1999 | Ito .............................. 198/345.1 |
| 7,303,063 B2 * | 12/2007 | Neu .............................. 198/717 |
| 7,669,903 B2 * | 3/2010 | Bonora et al. ................ 294/188 |
| 7,866,058 B2 * | 1/2011 | Kim et al. ....................... 34/381 |

* cited by examiner

*Primary Examiner* — Douglas Hess
(74) *Attorney, Agent, or Firm* — Harness, Dickey & Pierce, P.L.C.

(57) ABSTRACT

Provided is a system for handling a semiconductor module, the system may include a rotor, a rotational driving device, at least one insertion portion, and at least one extraction portion. The rotor may be configured to rotate clockwise and counter-clockwise around a rotation axis. The rotational driving device may be configured to rotate the rotor. The at least one insertion portion may be connected to the rotor and may be configured to insert a semiconductor module into a socket. The at least one extraction portion may be connected to the rotor and may be configured to extract the semiconductor module from the socket.

14 Claims, 13 Drawing Sheets

SYSTEM FOR HANDLING SEMICONDUCTOR MODULE

PRIORITY STATEMENT

This application claims priority under 35 U.S.C. §119 to Korean Patent Application No. 10-2008-0024890, filed on Mar. 18, 2008, in the Korean Intellectual Property Office (KIPO), the entire contents of which are herein incorporated by reference.

BACKGROUND

1. Field

Example embodiments relate to a system for handling a semiconductor module, and more particularly, to a system for handling a semiconductor module that allows operation of testing the semiconductor module to be performed.

2. Description of the Related Art

A semiconductor chip may be formed on a wafer using a semiconductor manufacture process. The semiconductor chip may be separated from the wafer in a separate process, and the manufacture of a semiconductor device may be completed using a packaging processes.

The completed semiconductor device may be combined with a circuit board having a circuit pattern in order to make a semiconductor module. Prior to finalizing the semiconductor module, the semiconductor module may be tested under various conditions that are similar to actual operating conditions.

A plurality of semiconductor modules may be held in a temporary tray, and each of the semiconductor modules may be manually inserted into a socket of a test equipment device, in order to test and initialize a semiconductor module.

The tested semiconductor module may be manually removed from the socket of test equipment device and placed on a forwarding tray and the semiconductor modules may be manually classified according to the testing result.

Manually testing the semiconductor modules may be a time consuming process, and various problems frequently occur due to operator's mistakes during handling operations when the semiconductor modules are moved, inserted, and extracted. In order to overcome these problems, the use of robots for handling semiconductor modules has been investigated. However, developing and using robots for this purpose may be difficult because of the shape difference between a socket and a tray. For example, simultaneously and quickly handling a relatively large amount of semiconductor modules that are held in a multi-layered structure in a relatively small space may be difficult. In addition, handling the semiconductor modules may be difficult because an interval between a socket and a tray may be relatively small due to use of various sensors and many cables.

SUMMARY

Example embodiments provide a system for handling a semiconductor module, which is efficiently configured by preventing or reducing interferences between sensors and installation cables such that an operation of handling a semiconductor module may be automated and a relatively large number of semiconductor modules, which may be held in a multi-layered structure in a relatively small space, may be quickly and correctly handled.

In accordance with example embodiments, a system for handling a semiconductor module may include a rotor, a rotation driving device, at least one insertion portion, and at least one extraction portion. The rotor may be configured to rotate clockwise or counterclockwise. The rotation driving device may be configured to rotate the rotor. The at least one insertion portion may be connected to the rotor at a first position and may be configured to insert a semiconductor module into a socket. The at least one extraction portion may be connected to the rotor at a second position and may be configured extract the semiconductor module from the socket. The rotor may be also be configured to move the at least one insertion portion and the at least one extraction portion near the socket.

In accordance with example embodiments, a system for handling a semiconductor module may include a rotor, a rotational driving device, at least one insertion portion, at least one extraction portion, and at least one controlling unit. The rotor may be configured to rotate clockwise and counterclockwise around a rotation axis. The rotational driving device may be configured to rotate the rotor. The at least one insertion portion may be connected to the rotor at a first position and may be configured to insert a semiconductor module into a socket. The at least one extraction portion may be connected to the rotor at a second position and may be configured to extract the semiconductor module from the socket. The controlling unit may be configured to generate and send a clockwise rotation signal to the rotation driving device for rotating the rotor clockwise to move the insertion portion to a position near the socket for inserting the semiconductor module. The controlling unit may also be configured to generate and send a counterclockwise rotation signal to the rotation driving device for rotating the rotor counterclockwise to move the extraction portion to a position near the socket for extracting the semiconductor module.

In accordance with example embodiments, a system for handling a semiconductor module may include a rotor, a rotational driving device, at least one insertion portion, and at least one extraction portion. The rotor may be configured to rotate clockwise and counterclockwise around a rotation axis. The rotational driving device configured to rotate the rotor. The at least one insertion portion may be connected to the rotor at a first position and may be configured to insert a semiconductor module into a socket. The at least one extraction portion may be connected to the rotor at a second position and may be configured to extract the semiconductor module from the socket.

BRIEF DESCRIPTION OF THE DRAWINGS

Example embodiments will be more clearly understood from the following detailed description taken in conjunction with the accompanying drawings.

FIG. 1 is a perspective view of a system for handling a semiconductor module according to example embodiments;

FIG. 2 is a plan view of the system of FIG. 1;

FIG. 3 is a cross-section view of the system of FIG. 1;

FIG. 4 is a perspective view of an insertion portion illustrated in FIG. 1, according to example embodiments;

FIG. 5 is a partial cross-sectional view of the insertion portion illustrated in FIG. 4, according to example embodiments;

FIG. 6 is a partial cross-sectional view of the insertion portion illustrated in FIG. 1 during an extraction operation of a semiconductor module from a tray, according to example embodiments;

FIG. 7 illustrates operations when the insertion portion inserts a semiconductor module into a socket, according to example embodiments;

FIG. 8 is a partial cross-sectional view of an extraction portion illustrated in FIG. 1, according to example embodiments;

FIG. 9 is a partial cross-sectional view of the extraction portion illustrated in FIG. 1 during an extraction operation a semiconductor module from a socket, according to example embodiments;

FIG. 10 illustrated operations in which the extraction portion illustrated in FIG. 1 extracts a semiconductor module from a socket, according to example embodiments;

FIG. 11 illustrates the case where a jig for confirming a position is installed on one side of the insertion portion or the extraction portion, according to example embodiments;

FIG. 12 illustrates the case where the jig is used for confirming a position; and FIG. 13 is a plan view illustrating a position of a magnet sensor installed on the insertion portion or the extraction portion illustrated in FIG. 1, according to example embodiments.

DETAILED DESCRIPTION OF EXAMPLE EMBODIMENTS

Figure 1:
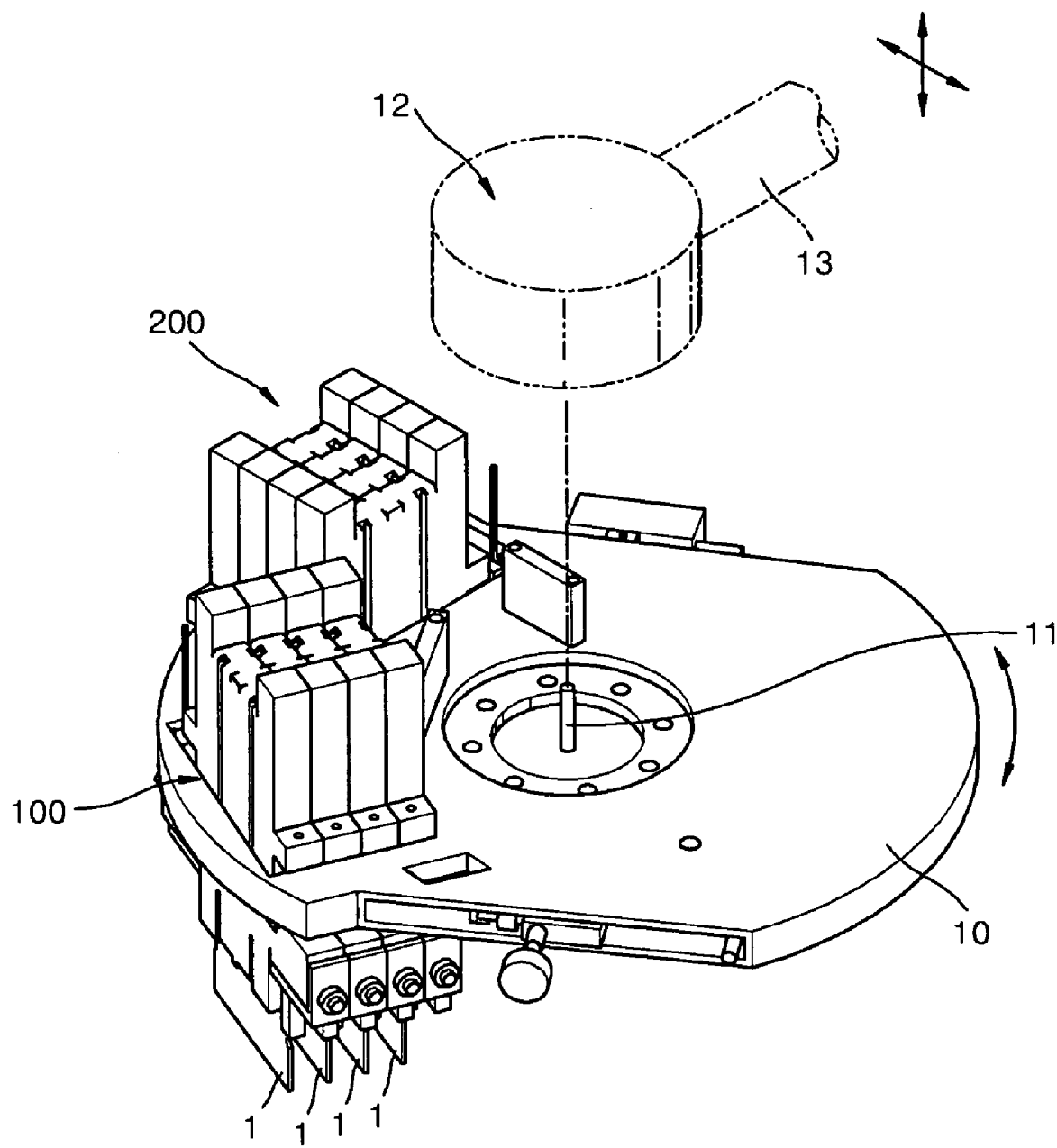
FIGS. 1-13 represent non-limiting, example embodiments as described herein.

Example embodiments will now be described more fully with reference to the accompanying drawings, in which example embodiments are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments.

Figure 2:
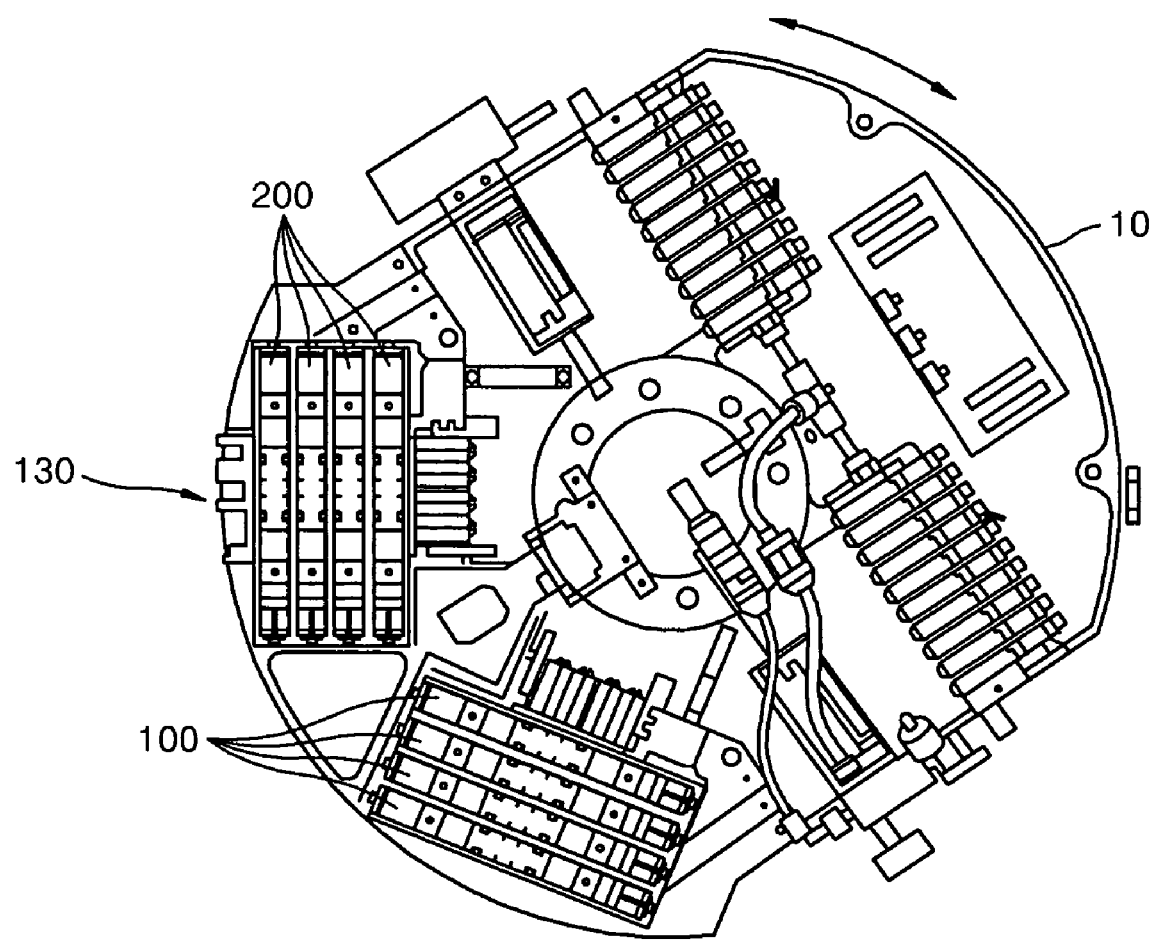
Figure 3:
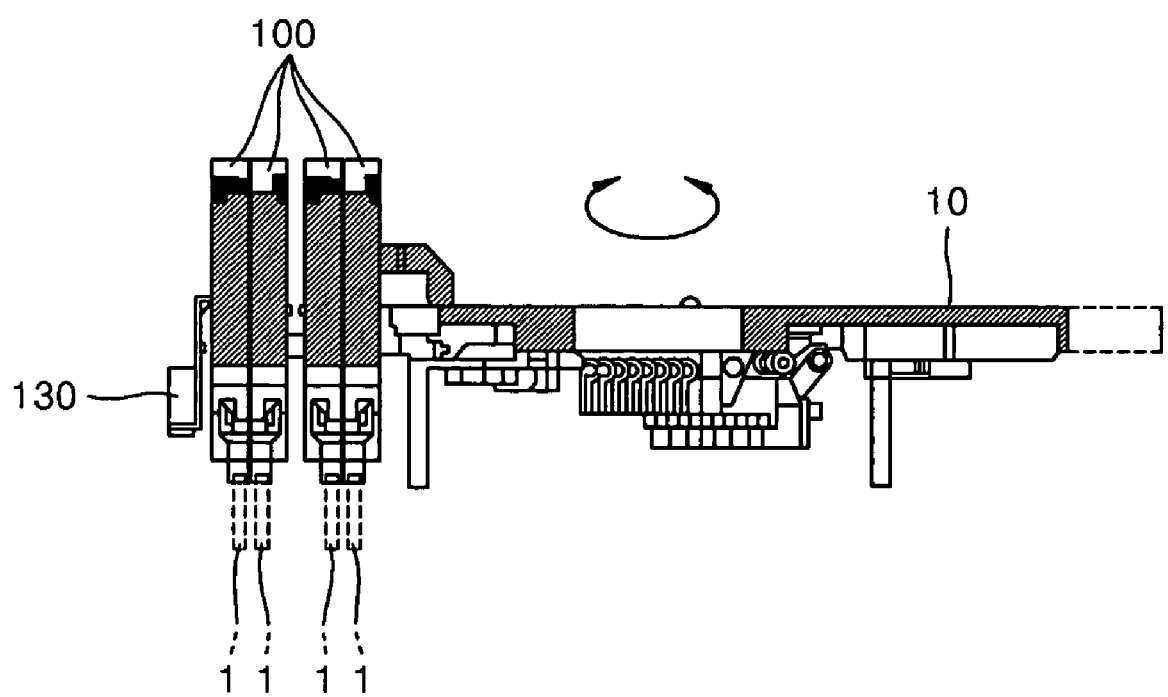

Referring to FIGS. 1 through 3, a system for handling a semiconductor module according to example embodiments may be configured so that a plurality of insertion portions 100 for loading a semiconductor module 1, and a plurality of extraction portions 200 for unloading the semiconductor module 1 may be installed on a rotor 10. The insertion portions 100 and the extraction portions 200 may be used to load and unload the semiconductor module 1 into and from a memory socket 2 (see FIG. 9). The memory socket may be installed on a test shelf including equipment similar to a general personal computer (PC).

The rotor 10 may rotate clockwise and/or counterclockwise around a rotation axis 11 by first and second rotation angles. As illustrated in FIGS. 1 and 2, the rotor 10 may have an overall circular shape. In addition, various devices, for example, pneumatic devices and/or circuit boards, may be installed on the rotor 10. A rotation driving device 12, e.g., a driving motor, may be installed on the rotor 10 to rotate it around the rotation axis 11 in clockwise and/or counterclockwise directions by first and second rotation angles. As illustrated in FIG. 1, the rotor 10 may be connected to a robot arm 13 so as to be moved vertically or horizontally.

The insertion portions 100 may be installed in the rotor 10 and may be positioned above a memory socket 2 by rotating the rotor 10. The position of the insertion portions 100 may correspond to a first rotation angle, and may be used to insert the semiconductor module 1 extracted from a tray 3 (see FIG. 6) into the memory socket 2. At least one insertion portion 100 may be installed on the rotor 10. For example, four insertion portions 100 are illustrated in FIG. 1.

The extraction portions 200 may be installed in the rotor 10 and may be positioned above a memory socket 2 by rotating the rotor 10. The position of the extraction portions 200 may correspond to a second rotation angle, and may be used to extract the semiconductor module 1 from the memory socket 2. At least one extraction portion may be installed on the rotor 10. For example, four extraction portions 200 are illustrated in FIG. 1.

In accordance with the above example, the four insertion portions 100 and the four extraction portions 200 may be installed on the rotor 10. When the rotor 10 rotates by the first rotation angle, the four semiconductor modules 1 may be simultaneously loaded in the memory socket 2. When the rotor 10 rotates by the second rotation angle, the four semiconductor modules 1 may be simultaneously unloaded from the memory socket 2. Although the above example illustrates a system with four insertion portions 100 and four extraction portions 200, example embodiments are not limited thereto.

Various numbers of insertion portions and extraction portions may be installed according to the configuration of a memory socket. For example, four memory sockets 2 including equipment similar to a general PC may be installed parallel to each other on a test shelf. The number of the insertion portions 100 and the extraction portions 200 may be each four because the number of the semiconductor modules 1 that may be simultaneously loaded or unloaded is four according to the configuration of the memory sockets 2.

Figure 4:
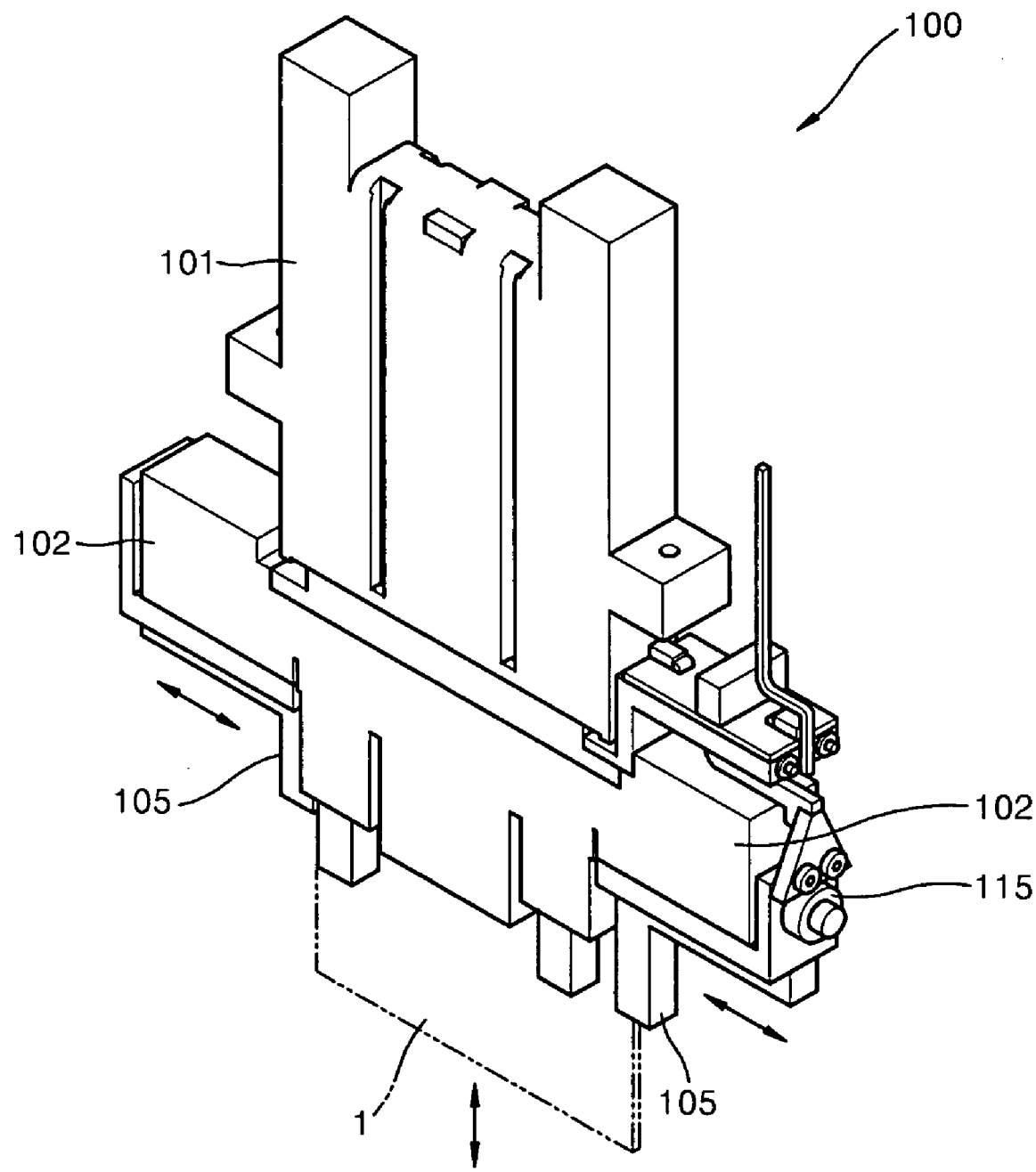
Figure 5:
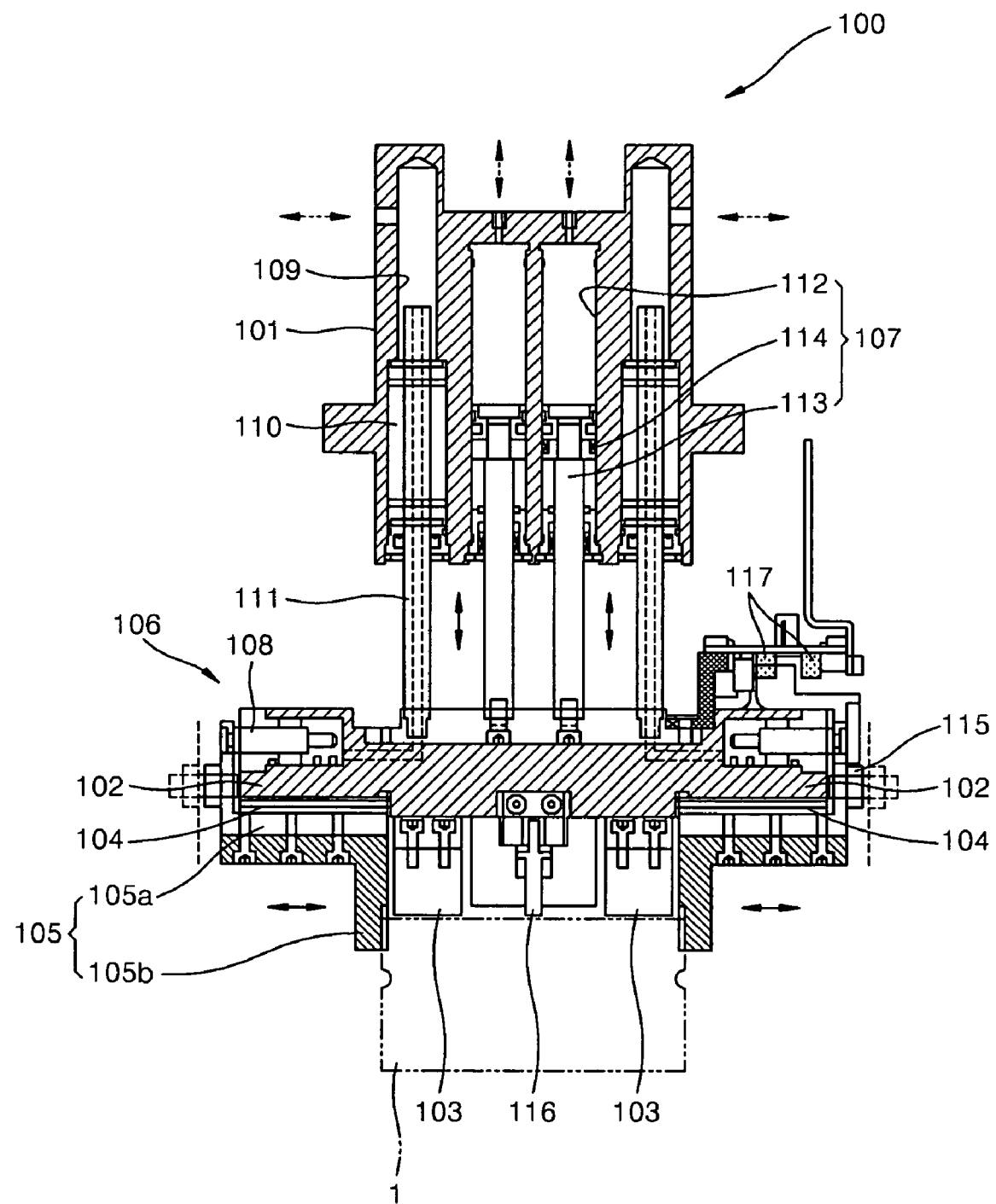

As illustrated in FIGS. 4 and 5, the insertion portion 100 may include an insertion portion body 101, a movable plate 102, a pusher 103, a gripper 105, a gripper driving device 106, and a movable plate driving device 107.

The insertion portion body 101 may be fixed to the rotor 10 by a fixing member, for example, a screw or a bolt, and may pass through the rotor 10 in a vertical direction.

The movable plate 102 may be connected to the insertion portion body 101 so as to be vertically moved. The pusher 103, the gripper 105, and the gripper driving device 106 may be installed in the movable plate 102 so as to be moved up and down together with the movable plate 102.

The pusher 103 may be installed on the movable plate 102, and may contact an upper surface of the semiconductor module 1 to press the semiconductor module 1 towards the memory socket 2. In example embodiments, the pusher 103 may be coupled to the movable plate 102 by screws so as to be easily replaced and/or demounted in case of wear or damage due to the contact with the semiconductor module 1.

The gripper 105 may be installed so as to be moved along a slider 104 towards the lateral surfaces of the semiconductor module 1 in order to grip both lateral surfaces of the semiconductor module 1. In accordance with example embodiments, the slider may be installed on the movable plate 102

As illustrated in FIG. 5, the gripper 105 may be coupled to a gripper body 105*a* by a screw so as to be easily replaced in case of wear or damage due to the contact with the semiconductor module 1, and may include a gripper finger 105*b* in contact with the semiconductor module 1.

A module groove 105*c* (see FIG. 6) corresponding to a lateral surface of the semiconductor module 1 may be formed in the gripper finger 105*b* so that the semiconductor module 1 may be tightly gripped.

The gripper driving device 106 may be installed in the movable plate 102. The gripper driving unit 106 may be configured to drive the gripper 105. The gripper driving device 106 may include a fluid cylinder 108 installed in the movable plate 102 in order to drive the gripper 105.

In example embodiments, a hydraulic pressure transferring line may be used to transfer hydraulic pressure. The hydraulic pressure transferring line may include a cylinder-shaped flow channel 109 through which a working fluid may pass. The cylinder-shaped flow channel 109 may be formed in the insertion portion body 101. The hydraulic pressure transferring line may also include a hollow rod 111 that may be connected to the cylinder-shaped flow channel 109 and that may be moved up and down together with the movable plate 102 along a linear bush 110.

The gripper 105 may be driven by transferring the pressure of working fluid along the hollow rod 111 via the cylinder-shaped flow channel 109.

Because a separate tube for transferring the hydraulic pressure is not required, the handling system may be simplified. In addition, a path for transferring fluid pressure may be positioned inside the insertion portion 100, thereby improving the stability when hydraulically driving the gripper 105.

The movable plate driving device 107, which may be installed in the insertion portion body 101, may include two fluid cylinders 112, which may be installed in the insertion portion body 101 and may be configured so as to move up and down the movable plate 102 when two pistons 113 compress/eject fluid in/from the fluid cylinders 112. Although FIG. 5 illustrates only two fluid cylinders 112, example embodiments are not limited thereto. For example, the movable plate driving device 107 could include only a single fluid cylinder or more that one fluid cylinder.

In addition, as illustrated in FIG. 5, a stopper 115 may be installed in the insertion portion 100, between the movable plate 102 and the gripper 105.

The stopper 115 may be moved using a screw so as to regulate the distance between the grippers 105. For example, the stopper 115 may be configured to correspond to the size of the semiconductor module 1 by controlling the degrees of opening and closing of the gripper 105.

The insertion portion 100 may further include a module detection sensor 116 and an open/close detection sensor 117. The module detection sensor may be installed in the movable plate 102 and may detect the semiconductor module 1 gripped by the gripper 105. The open/close detection sensor 117 may detect opening and closing positions.

The module detection sensor 116 may be a contact sensor that comes in contact with the semiconductor module 1 to detect missing the semiconductor module 1. The open/close detection sensor 117 may be an infrared sensor detecting an extension plate connected to the gripper body 105*a*. In addition, various types of sensors may be used as the module detection sensor 116 or the open/close detection sensor 117.

Figure 11:
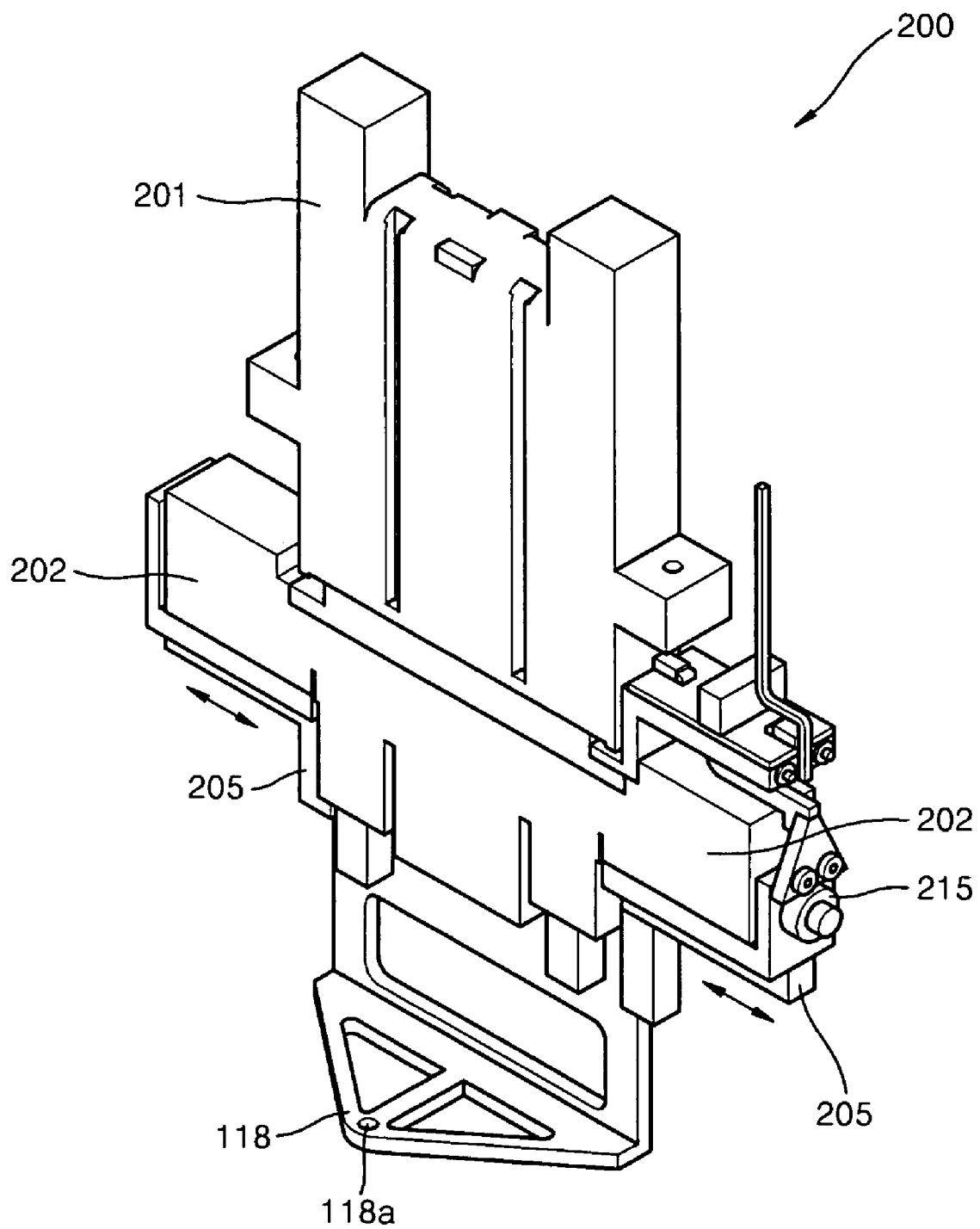
Figure 12:
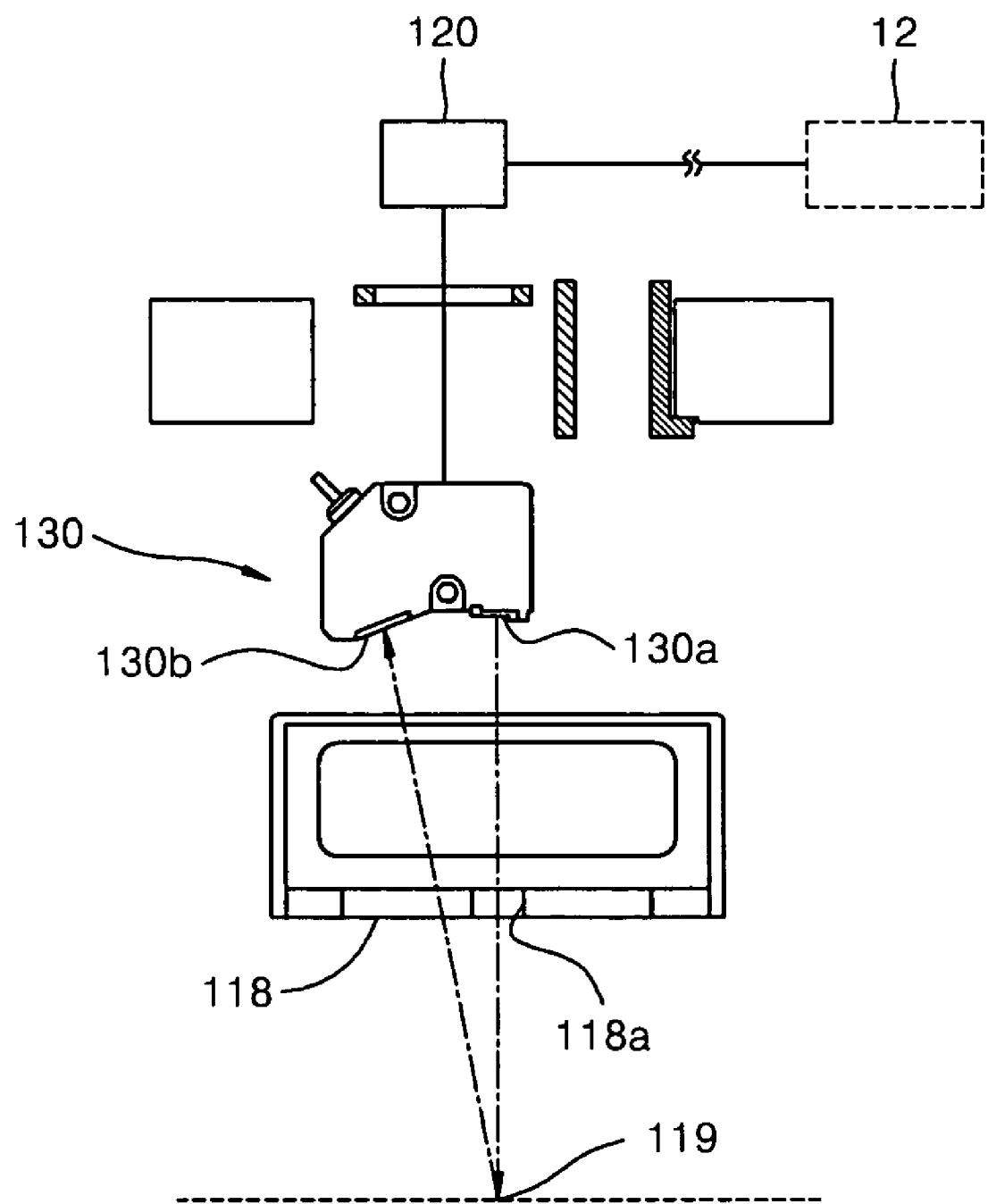

As illustrated in FIGS. 11 and 12, the system for handling a semiconductor module according to example embodiments may further include a position confirming sensor 130 and a controlling unit 120.

The position confirming sensor 130 may be installed in the rotor 10, and may include a light emitting unit 130*a* and a light receiving unit 130*b*. The light emitting unit 130*a* may output an optical signal (e.g., a laser optical signal) so as to confirm the position of the memory socket 2. The light receiving unit 130*b* may receive the optical signal that passes through a through hole 118*a* of a jig 118 to be reflected on an alignment point 119.

In addition, the controlling unit 120 may receive a position signal from the position confirming sensor 130 and may send a rotational controlling signal to the rotation driving device 12.

The correct position of the memory socket 2, on which the alignment point 119 may be indicated, may be obtained by the position confirming sensor 130, and thus the correct rotation angle of the rotor 10 may be determined.

Such position alignment may be performed in an initial stage when the jig 118 is installed into the insertion portion 100 or the extraction portion 200, and then the jig 118 is removed from the insertion portion 100 or the extraction portion 200, thereby completing the position alignment. Alternatively, the position alignment may be performed in real time when handling a semiconductor 1 on a regular/irregular basis.

Figure 6:
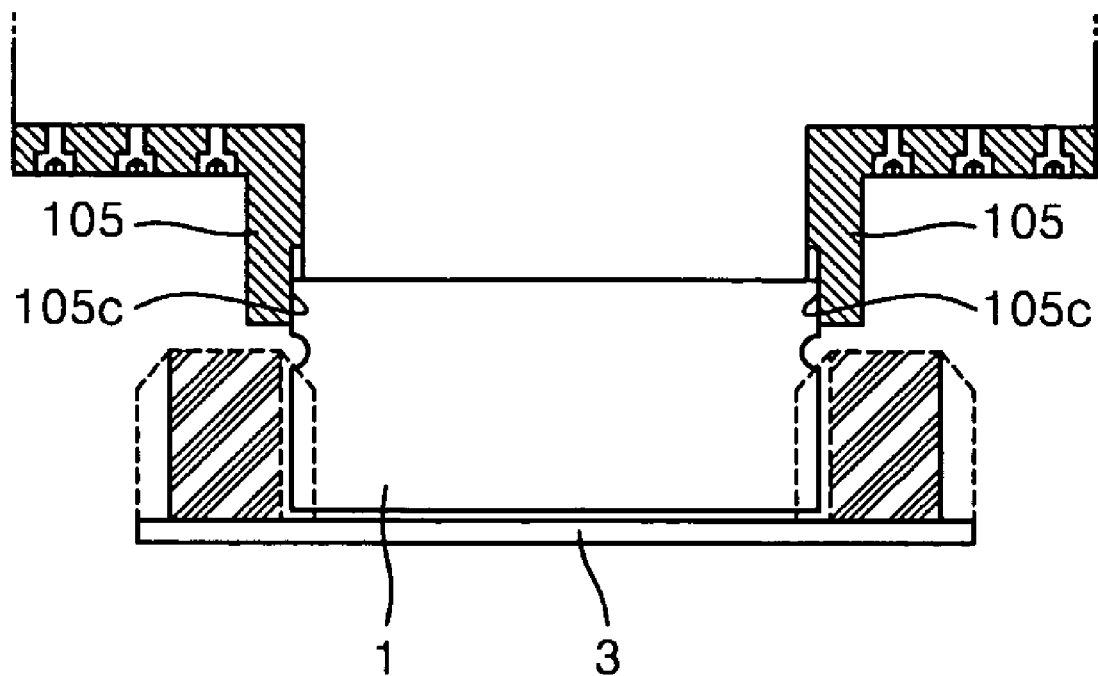

As described above, in the system for handling a semiconductor module according to example embodiments, the insertion portion 100 may operate as follows. Referring to FIG. 6, the semiconductor module 1 may be held in a tray 3 and may be gripped by closing the gripper 105. In operation S11 illustrated in FIG. 7, the movable plate driving device 107 may move up the movable plate 102 so that the semiconductor module 1 may be moved to a position of the memory socket 2.

Figure 7:
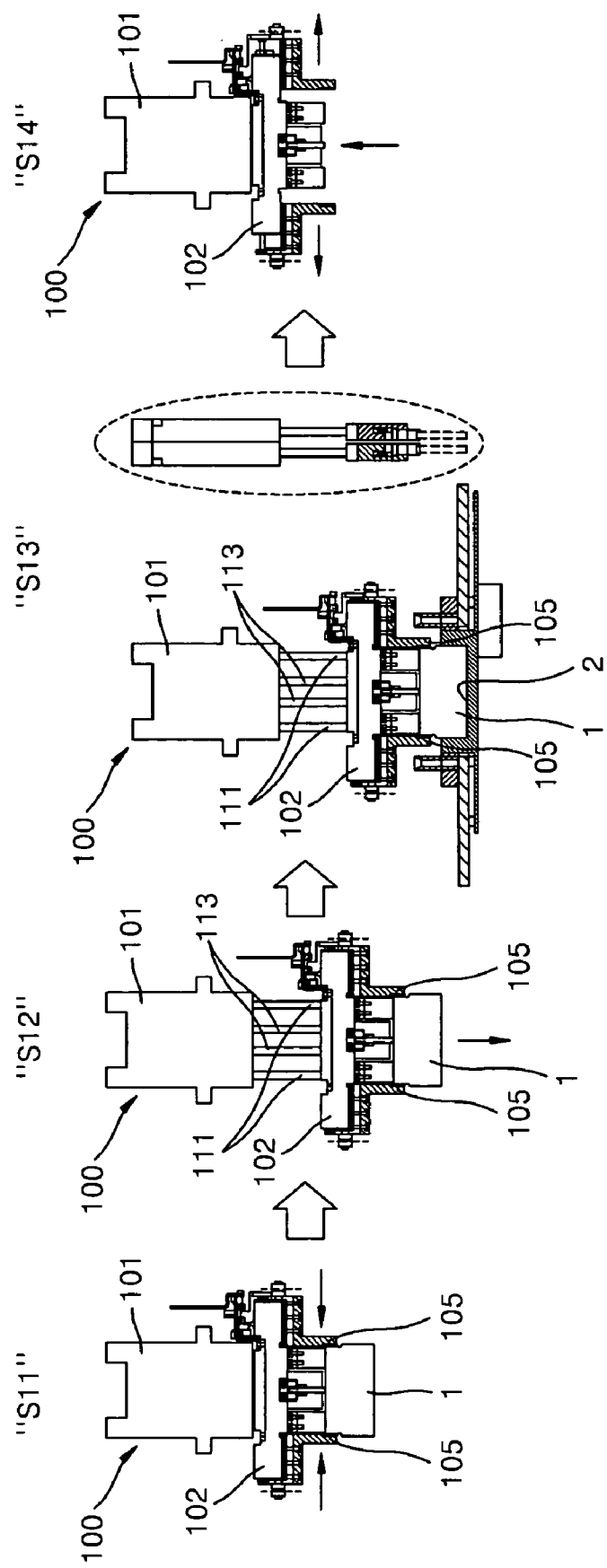

In operation S12 illustrated in FIG. 7, the movable plate driving device 107 may move down the movable plate 102. In operation S13 illustrated in FIG. 7, the robot arm 13 may move down the rotor 10 so that the pusher 103 presses the semiconductor module 1, thereby inserting the semiconductor module 1 into the memory socket 2. The semiconductor module 1 may be inserted into the memory socket 2 by moving down the movable plate 102 without moving down the robot arm 13.

In operation S14 illustrated in FIG. 7, the movable plate driving device 107 may move up the movable plate 102 such that the gripper 105 may open in a stand-by state.

Figure 8:
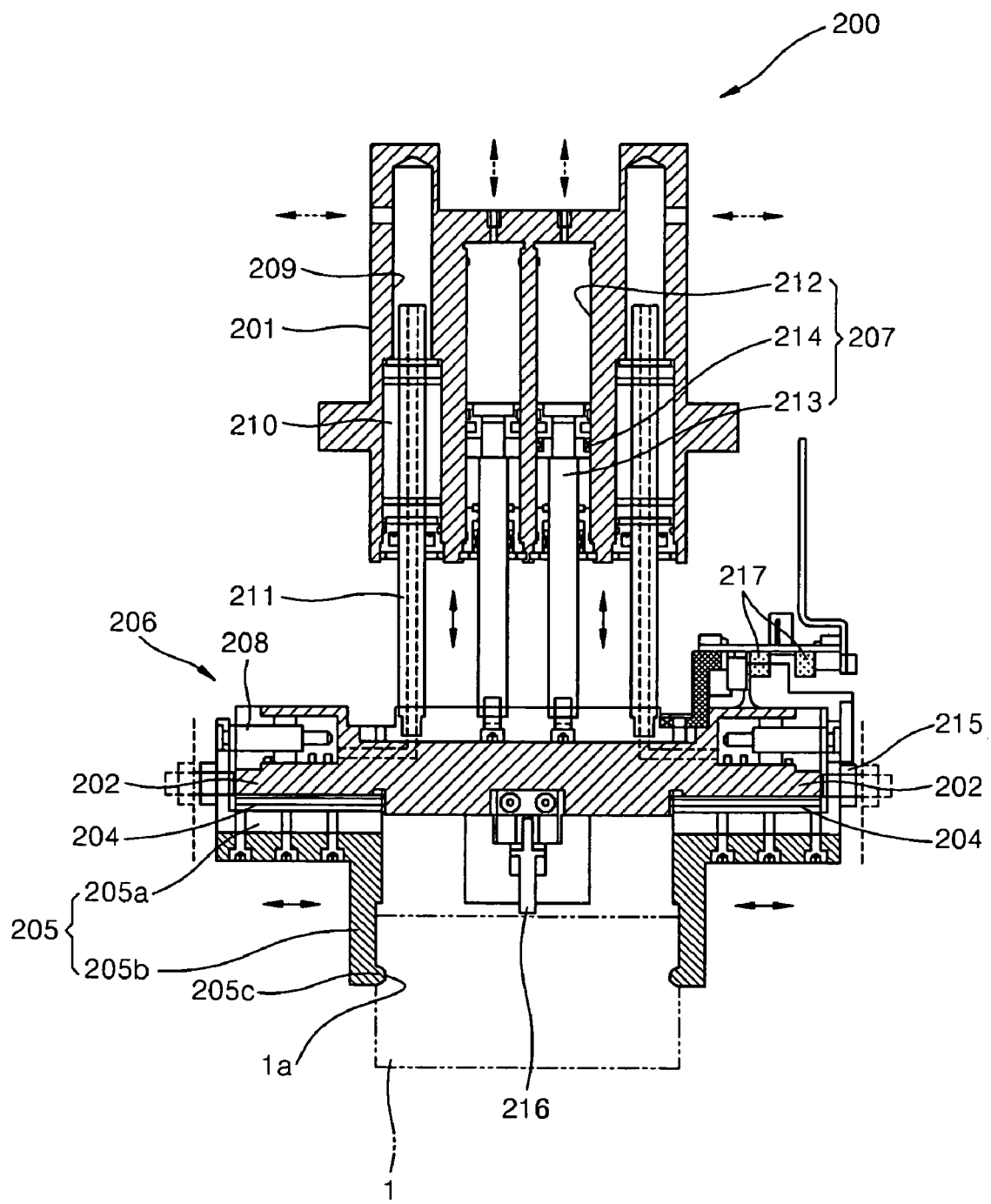

As illustrated in FIG. 8, the extraction portion 200 may include an extraction portion body 201, a movable plate 202, a gripper 205, a gripper driving device 206 and a movable plate driving device 207.

The extraction portion body 201 may be fixed to the rotor 10 by a fixing member, e.g., screws and/or bolts, and may pass through the rotor 10 in a vertical direction.

The movable plate 202 may be connected to the extraction portion body 201 so as to be vertically moved. The gripper 205 and the gripper driving device 206 may be installed in the movable plate 202 so as to be moved up and down together with the movable plate 202.

A pusher is not required in the extraction portion 200. Thus, the extraction portion 200 may have the same structure as the insertion portion 100 except that the pusher 103 is not included.

In addition, the gripper 205 may be installed so as to be moved along a slider 204 towards a lateral surface of the semiconductor module 1 in order to grip both lateral surfaces of the semiconductor module 1. In accordance with example embodiments, the slider 204 may be installed on the movable plate 202.

As illustrated in FIG. 8, the gripper 205 may be coupled to a gripper body 205a by a fastening device, e.g., a screw, so as to be easily replaced in case of wear or damage due to contact with the semiconductor module 1. The gripper 205 may also include a gripper finger 205b in contact with the semiconductor module 1.

The gripper finger 205b of the extraction portion 200, may include a flange 205c. The flange 205c may correspond to a groove 1a that may be formed in a surface of the semiconductor module 1. Thus, the semiconductor module 1 may be extracted by tightly gripping the semiconductor module inserted into the memory socket 2

The gripper driving device 206 may be installed in the movable plate 202, and may drive the gripper 205. The gripper driving device 206 may be a fluid cylinder 208 installed in the movable plate 202 in order to drive the gripper 205.

In example embodiments, a hydraulic pressure transferring line may be used to transfer hydraulic pressure. The hydraulic pressure transferring line may include a cylinder-shaped flow channel 209 through which a working fluid may pass and which may be formed in the extraction portion body 201. The hydraulic pressure transferring line may also include a hollow rod 211 that may be moved up and down together with the movable plate 202 along a linear bush 210.

The gripper 205 may be driven by transferring the pressure of working fluid along the hollow rod 211 along the hollow rod 211 via the cylinder-shaped flow channel 209.

Accordingly, because a separate tube for transferring hydraulic pressure is not required, the handling system may be simplified. In addition, a path for transferring the fluid pressure may be positioned inside the extraction portion 200, thereby improving the stability when hydraulically driving the gripper 205.

The movable plate driving device 207 may be installed in the extraction portion body 201 and may move up and down the movable plate 202. According to example embodiments, the movable plate driving device 207 may include two fluid cylinders 212 which may be installed in the extraction portion body 201 and may be configured so as to move up and down the movable plate 202 while tow pistons 213 compress or eject fluid in the fluid cylinders 212. Although the movable plate driving mechanism 207 is illustrated with two cylinders, example embodiments are not limited thereto. For example, the movable plate driving mechanism 207 may only include one fluid cylinder or, in the alternative, may include more than one fluid cylinder.

In addition, as illustrated in FIG. 8, a stopper 215 may be installed in the extraction portion 200, between the movable plate 202 and the gripper 205.

The stopper 215 may be moved using a positioning mechanism, e.g., a screw, so as to regulate the distance between the grippers 205. The stopper 215 may be configured to correspond to the size of the semiconductor module 1 by controlling the degrees of opening and closing of the gripper 205.

The extraction portion 200 may further include a module detection sensor 216 and an open/close detection sensor 217. The module detection sensor 216 may be installed in the movable plate 202 and may detect the semiconductor module 1 gripped by the gripper 205. The open/close detection sensor 217 may detect opening and closing positions.

The module detection sensor 216 may be a contact sensor that detects the semiconductor module 1. The open/close detection sensor 217 may be an infrared sensor detecting an extension plate connected to the gripper body 205a. In addition, various types of sensors may be used as the module detection sensor 216 and the open/close detection sensor 217.

Figure 10:
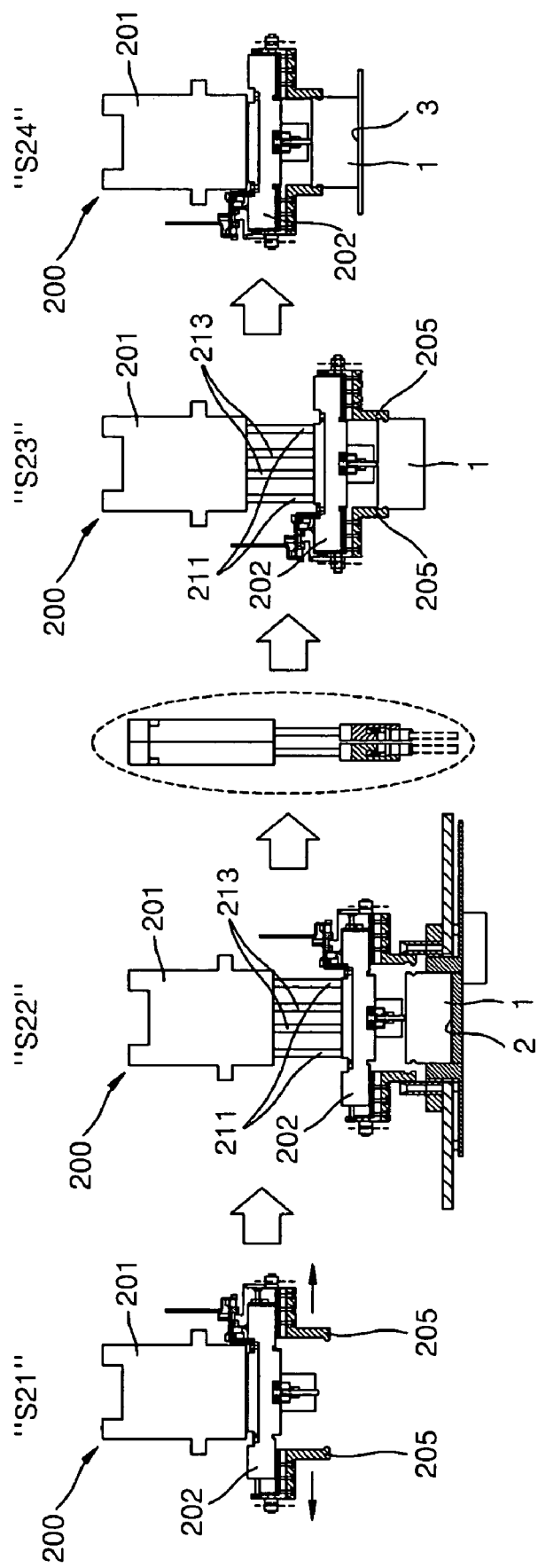

As described above, in the system for handling a semiconductor module according to example embodiments, the extraction portion 200 may operate as follows. Referring to FIG. 10, in operation S21, the movable plate driving device 207 may move up the movable plate 202 and the movable plate 202 may be moved to a position of the memory socket 2 while the gripper 205 is in an open position.

Figure 9:
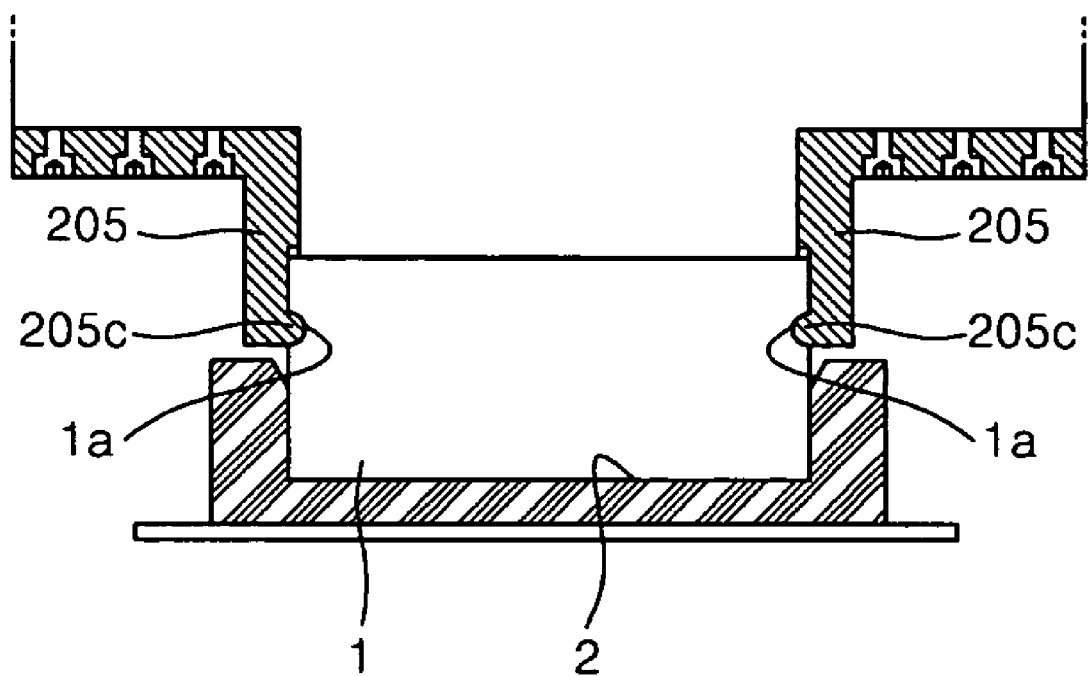

In operation S22 illustrated in FIGS. 9 and 10, the movable plate driving device 207 may move down the movable plate 202 and the semiconductor module 1 may be gripped by closing the gripper 205.1n operation S23 illustrated in FIG. 10, the robot arm 13 may move up the rotor 10 such that the gripper 205 may extract the gripped semiconductor module 1 from the memory socket 2. The semiconductor module 1 may be extracted by moving up the movable plate 202 without moving up the robot arm 13.

Figure 13:
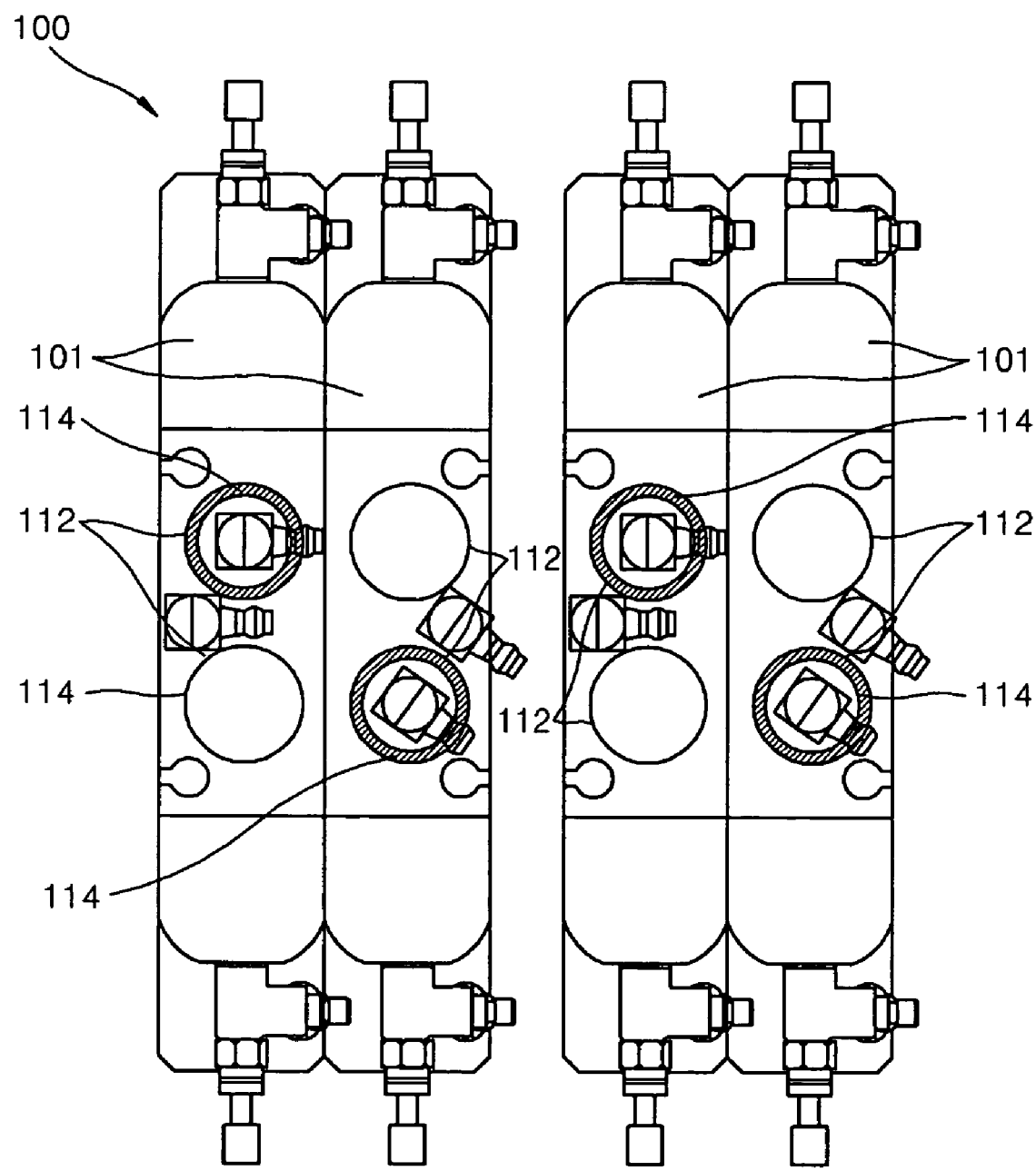

In operation S24, illustrated in FIG. 10, the robot arm 13 may move up the movable plate 202 to a position corresponding to a position of a tray 3, and the semiconductor module 1 may be held in the tray 3 such that the gripper 205 is open in a stand-by state. As illustrated in FIGS. 5 and 13, the two fluid cylinders 112 may be installed in the insertion portion body 101. A magnet sensor 114 detecting the position of the movable plate 102 may be installed on an end of a piston 113 installed in the fluid cylinder 112. The magnet sensor 114 may be installed in one of two pistons 113 so as to be diagonally opposite to an adjacent magnet sensor installed in an insertion portion body adjacent to the insertion portion body 101 such that the magnetic field of the magnet sensor 114 does not interfere with that of the adjacent magnet sensor 114.

In accordance with example embodiments, a system for handling a semiconductor modules allows for semiconductor modules to be stably and easily loaded and unloaded by automating a handling operation, and a large number of semiconductor modules that may be held in a multi-layered structure in a small space may be quickly and correctly handled. Thus, by optimum or improved instrumental design, the system may be efficiently configured.

While example embodiments have been particularly shown and described with reference to example embodiments thereof, it will be understood by those of ordinary skill in the art that various changes in form and details may be made therein without departing from the spirit and scope of the following claims.

What is claimed is:

1. A system for handling a semiconductor module, the system comprising:
a rotor configured to rotate clockwise or counterclockwise;
a rotation driving device configured to rotate the rotor;
at least one insertion portion configured to insert a semiconductor module into a socket, the at least one insertion portion connected to the rotor at a first position; and
at least one extraction portion configured to extract the semiconductor module from the socket, the at least one extraction portion connected to the rotor at a second position, wherein the rotor is further configured to move the at least one insertion portion and the at least one extraction portion near the socket, wherein the insertion portion includes:
an insertion portion body connected to the rotor;
a movable plate connected to the insertion portion body, the movable plate configured to move up and down;
a pusher on the movable plate, the pusher configured to contact an upper surface of the semiconductor module and configured to press the semiconductor module towards the socket;
a gripper configured to grip both lateral surfaces of the semiconductor module, the gripper being further configured to move along a slider, the slider being on the movable plate and the slider being configured to direct the gripper towards a lateral surface of the semiconductor module;
a gripper driving device in the movable plate and configured to drive the gripper; and
a movable plate driving device in the insertion portion body configured to move the movable plate up and down.

2. The system of claim 1, wherein the pusher is connected to the movable plate by a screw.

3. The system of claim 1, wherein the gripper includes a gripper finger connected to a gripper body by a screw.

4. The system of claim 1, wherein the gripper includes a module groove corresponding to a lateral surface of the semiconductor module.

5. The system of claim 1, wherein the gripper driving device includes a fluid cylinder in the movable plate.

6. The system of claim 5, wherein the fluid cylinder is connected to a hydraulic pressure transferring line, the hydraulic pressure transferring line including a cylinder-shaped flow channel in the insertion portion body and a hollow rod connected to the cylinder-shaped flow channel, the hollow rod configured to move up and down together with the movable plate along a linear bush.

7. The system of claim 1, wherein the movable plate driving device is a fluid cylinder in the insertion portion body.

8. The system of claim 1, wherein the movable plate driving device includes at least two fluid cylinders in the insertion portion body, each fluid cylinder including a piston with a magnet sensor for detecting a position of the movable plate, the sensors of adjacent pistons being installed in a diagonally opposite pattern.

9. The system of claim 1, further comprising:
a stopper between the movable plate and the gripper, the configured to regulate a distance between grippers.

10. The system of claim 1, further comprising:
a module detection sensor in the movable plate configured to detect the semiconductor module; and
an open/close detection sensor configured to detect opening and closing positions.

11. A system for handling a semiconductor module, the system comprising:
a rotor configured to rotate clockwise or counterclockwise;
a rotation driving device configured to rotate the rotor;
at least one insertion portion configured to insert a semiconductor module into a socket, the at least one insertion portion connected to the rotor at a first position; and
at least one extraction portion configured to extract the semiconductor module from the socket, the at least one extraction portion connected to the rotor at a second position, wherein the rotor is further configured to move the at least one insertion portion and the at least one extraction portion near the socket, wherein the insertion portion includes:
an extraction portion body connected to the rotor;
a movable plate connected to the extraction portion body, the movable plate configured to move up and down;
a gripper configured to grip both lateral surfaces of the semiconductor module, the gripper being further configured move along a slider, the slider being on the movable plate and the slider being configured to direct the gripper towards a lateral surface of the semiconductor module;
a gripper driving device in the movable plate and configured to drive the gripper; and
a movable plate driving device in the extraction portion body configured to move the movable plate up and down.

12. The system of claim 11, wherein the gripper includes a flange corresponding to a groove formed in a surface of the semiconductor module.

13. A system for handling a semiconductor module, the system comprising:
a rotor configured to rotate clockwise or counterclockwise;
a rotation driving device configured to rotate the rotor;
at least one insertion portion configured to insert a semiconductor module into a socket, the at least one insertion portion connected to the rotor at a first position;
at least one extraction portion configured to extract the semiconductor module from the socket, the at least one extraction portion connected to the rotor at a second position, wherein the rotor is further configured to move the at least one insertion portion and the at least one extraction portion near the socket;
a position confirming sensor in the rotor, the position confirming sensor including a light emitting unit configured to output an optical signal to confirm a position of the socket and a light receiving unit configured to receive the optical signal that passes through a through hole of a jig to be reflected on a alignment point; and
a controlling unit configured to receive a position signal from the position confirmation sensor and configured to send a rotation controlling signal to the rotation driving device.

14. The system of claim 13, wherein the rotation driving device is a driving motor.

* * * * *